United States Patent [19]
Hoshi

[11] Patent Number: 5,166,603
[45] Date of Patent: Nov. 24, 1992

[54] PROBE METHOD

[75] Inventor: Seiichi Hoshi, Kofu, Japan

[73] Assignee: Tokyo Electron Limited, Tokyo, Japan

[21] Appl. No.: 696,930

[22] Filed: May 8, 1991

[30] Foreign Application Priority Data

May 10, 1990 [JP] Japan .................. 2-120679

[51] Int. Cl.[5] .............. G01R 31/28; G01R 31/02
[52] U.S. Cl. ........................ 324/158 P; 324/158 F
[58] Field of Search ........... 324/158 P, 158 F, 158 R, 324/72.5, 73.1; 437/8

[56] References Cited

U.S. PATENT DOCUMENTS 4,856,904 8/1989 Akagawa .................. 324/158 F
4,899,105 2/1990 Akiyama .................. 324/158 R

FOREIGN PATENT DOCUMENTS 62-35212 2/1987 Japan .

Primary Examiner—Ernest F. Karlsen
Attorney, Agent, or Firm—Oblon, Spivak, McClelland, Maier & Neustadt

[57] ABSTRACT

There is executed a probe method wherein probe needles are brought into contact with electrode pads of chips to be measured arranged on a semiconductor wafer and an electronic characteristic thereof is measured in each measuring stage in a probe apparatus having a plurality of measuring stages on one loader. First of all, one opening stage in the measuring stage is detected and the wafer is transferred to the one stage. In one stage, the wafer is loaded on a mount which is operatable in X, Y, Z, and θ directions. In consideration of the relationship between the array direction of the chip and a measuring order of the chip and the corresponding relationship between the probe needles and the electrode pads, the wafer is positioned with respect to the probe needles. According to the method, it can be discriminated whether or not the wafer is circular. Also, it can be discriminated whether or not a detecting member having a tactile sense detecting the contact between the probe needles and the chip is used when measuring. Moreover, it can be discriminated whether or not the range of the chips to be measured on the wafer is designated. Also, it can be discriminated whether or not the tips of the needles are polished.

19 Claims, 9 Drawing Sheets

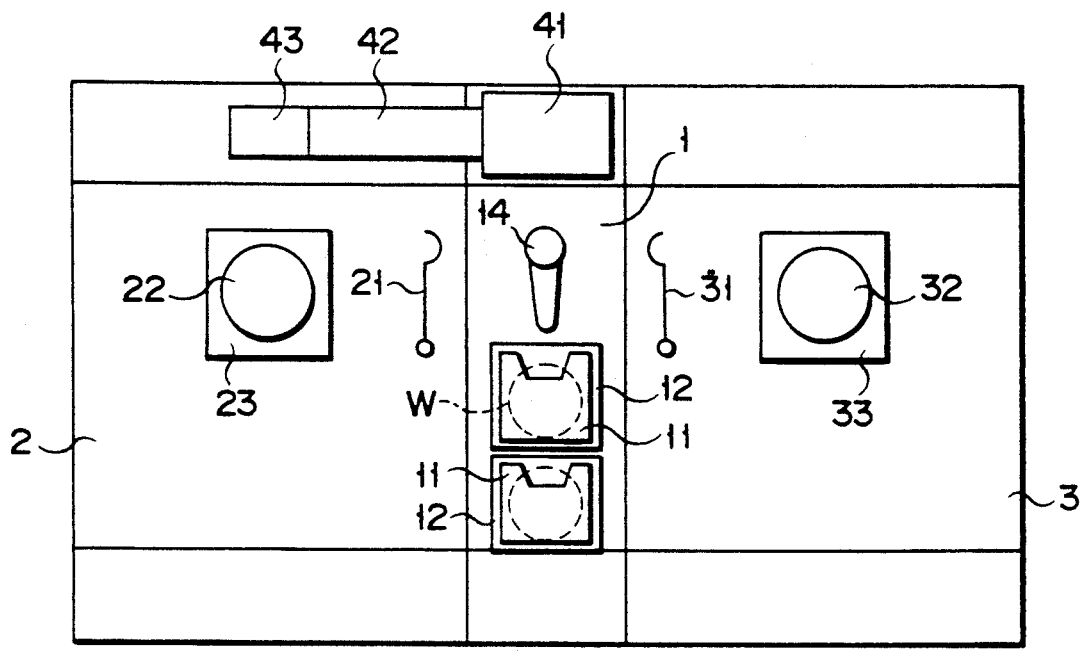
F I G. 1
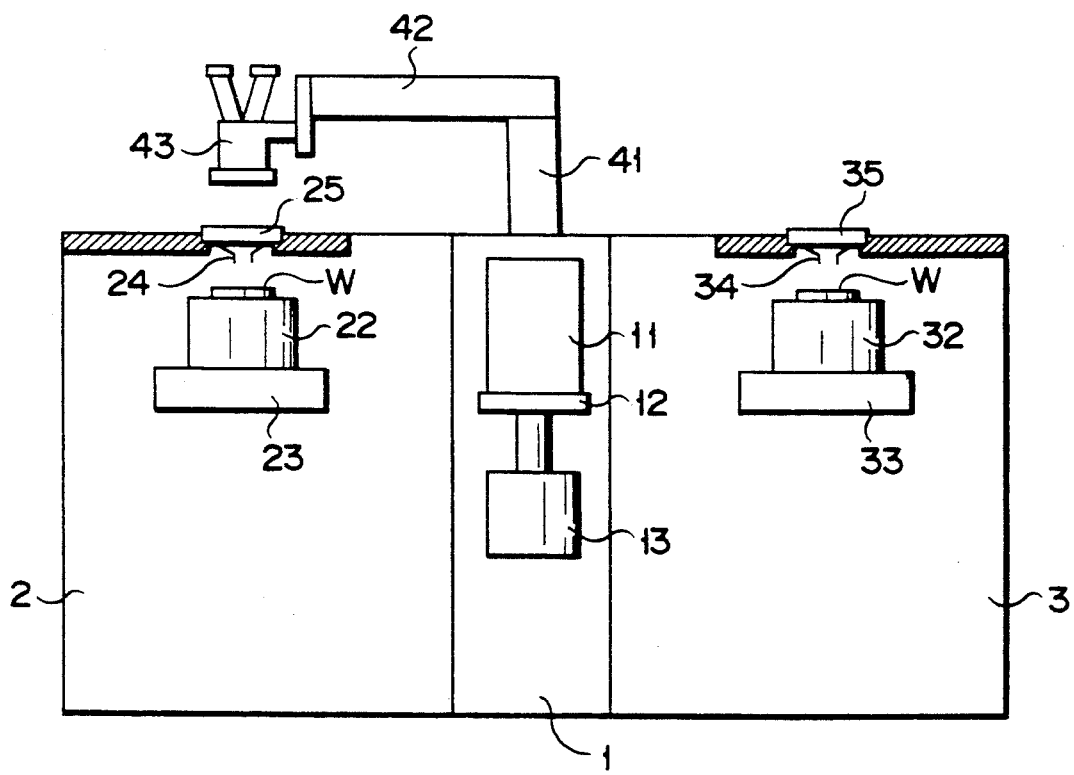
F I G. 2

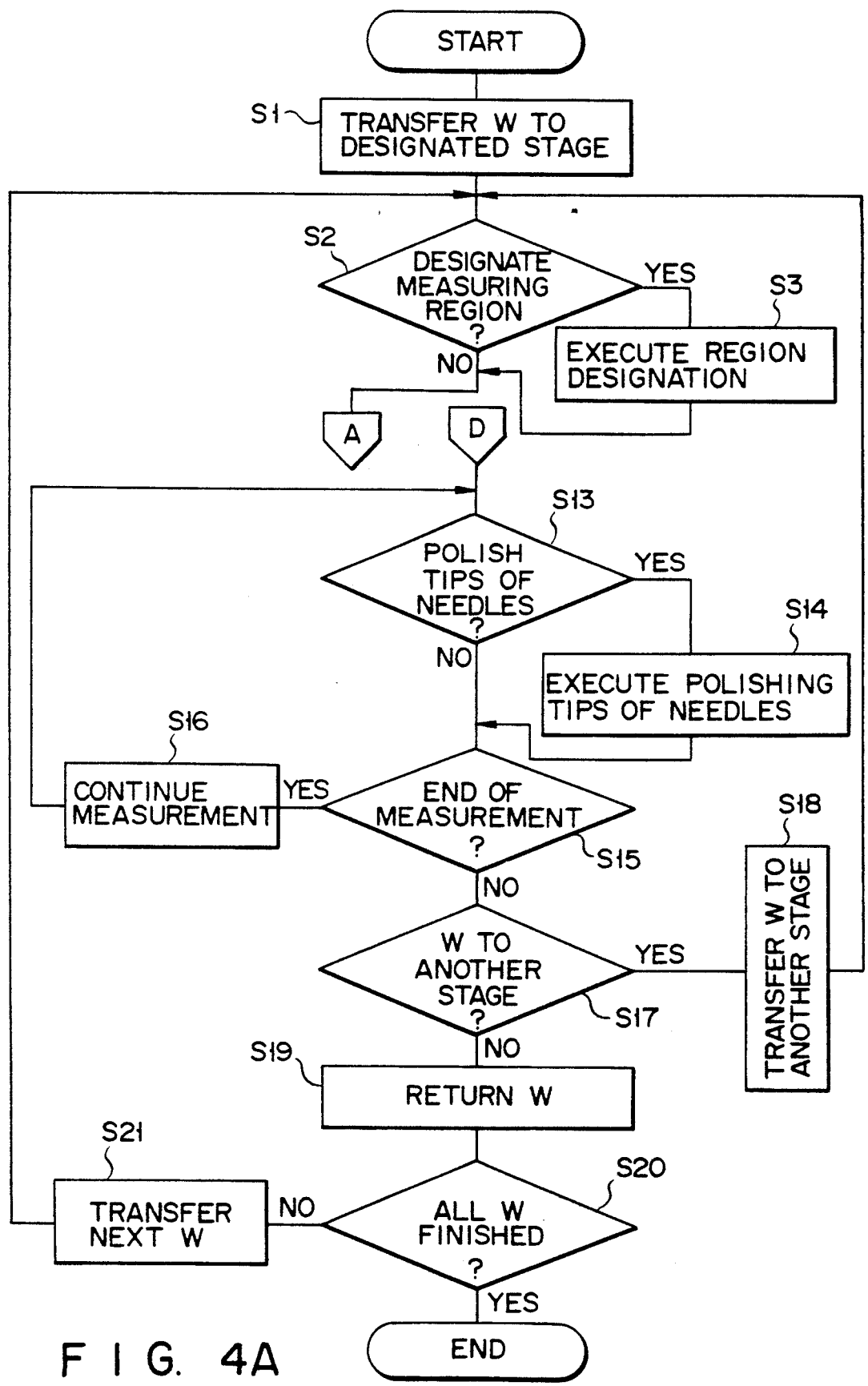
F I G. 4A

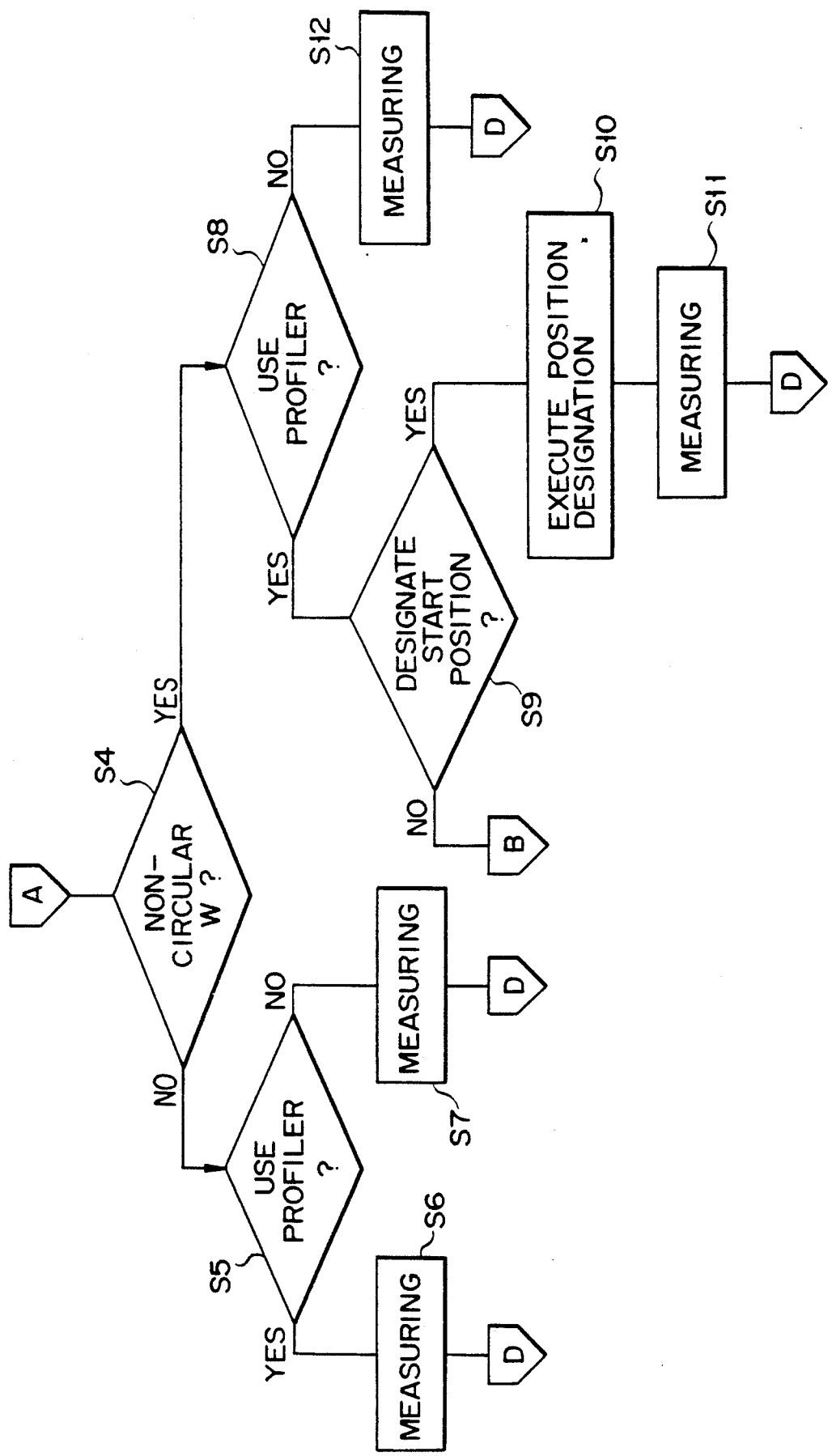
F I G. 4B

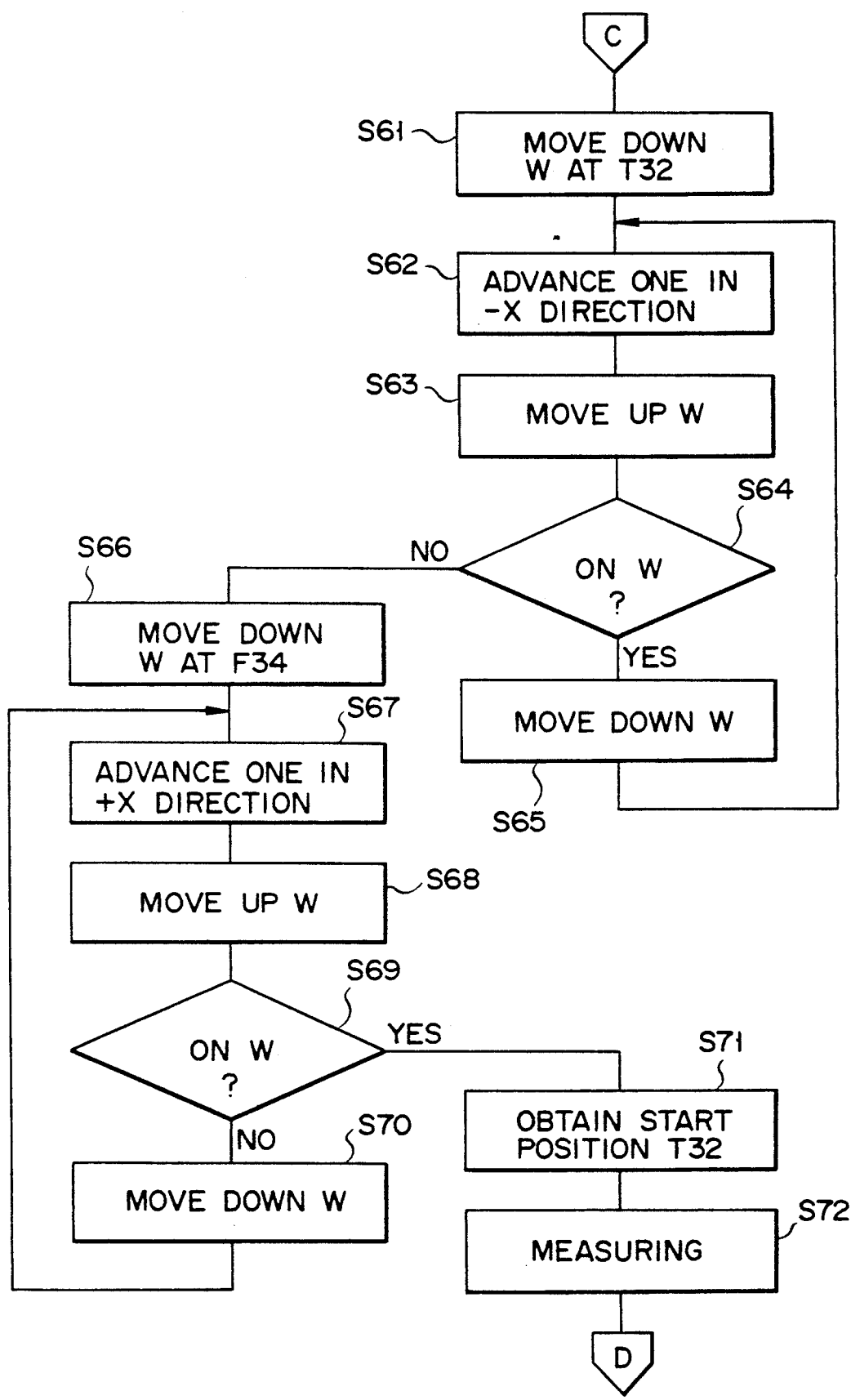
F I G. 4D

PROBE METHOD

BACKGROUND OF THE INVENTION

1. Field of the Invention

The present invention relates to a probe method.

2. Description of the Related Art

As one of the measurements in a semiconductor manufacturing process such as an integrated circuit (IC) and the like, a probe measurement is used. In the probe measurement, an object to be measured, such as a semiconductor chip, which is completed by a pattern formation on a semiconductor wafer, is electrically connected to a measuring circuit (tester) included in a measuring apparatus by use of a probe needle, so that an electrical characteristic is measured.

Conventionally, a general probe apparatus comprises a measuring stage and a loader for loading and transferring a wafer onto the measuring stage.

Recently, there has been proposed a probe apparatus comprising at least two measuring stages and one loader in one probe apparatus so as to efficiently use a space of an expensive clean room, and improve a throughput in the measuring step (for example, Published Unexamined Japanese Patent No. 62 35212). In this probe apparatus, the loader is arranged in the central portion, and the measuring stages are respectively arranged in right and left sides. The semiconductor wafers are dispersed to the right and left sides from the loader, so that two measuring stages are efficiently used to improve the throughput.

In the measuring step, there is a case in which the same kind of wafer is measured in a different measuring mode. Conventionally, if the measuring is performed in the different mode, a different probe apparatus is used. However, if a plurality of apparatuses are provided in the clean room, the clean room having a large space must be provided, so that the cost of equipment increases.

Moreover, the above probe apparatus having a plurality of measuring stages aims to improve the throughput by dispersing the wafers stored in a cassette to the right and left stages. Therefore, it was not considered that the measuring in the different measuring mode must be performed in each measuring stage.

SUMMARY OF THE INVENTION

In consideration of the above problems, an object of the present invention is to provide a probe method for efficiently using a plurality of measuring stages.

Moreover, an object of the present invention is to provide a probe method for dealing with a non-circular wafer.

To attain the above objects, according to the present invention, a probe method wherein probe needles are brought into contact with electrode pads of objects to be measured arranged on a substrate and an electrical characteristic thereof is measured in each measuring stage in a probe apparatus having a plurality of measuring stages on one loader, comprises the steps of:

detecting one opening stage and transferring the substrate to the one stage;

loading the substrate on a mount movable in the X-Y directions crossing each other in a plane and rotatable in the one stage;

positioning the substrate with respect to the probe needles based on the relationship between the array direction of the objects on the substrate and a measuring order of the objects and the corresponding relationship between the probe needles and the electrode pads;

discriminating whether the substrate is circular or not;

discriminating whether detecting means, which has a tactile sense detecting contact between the probe needles and the object, is used or not when measuring;

sequentially measuring each object as the substrate is moved with the mount with respect to the probe needles; and removing the substrate from the mount after the en of measuring.

In a preferred embodiment, after the end of measuring, it is discriminated whether or not measuring is to be performed in the other measuring stage. Then, the substrate is removed from the mount. Also, the present invention further comprises the steps of discriminating whether or not the range of the objects to be measured in the substrate is designated, and discriminating whether or not the tip of the probe needles are polished.

According to the probe apparatus using the method of the present invention, parameters for controlling the operation of each measuring stage are respectively input from input means, and each measuring stage performs the operation set by the parameters.

For example, in order to measure the wafer in a carrier mounted on the loader, the selection, in which the measurement is performed in either one of two measuring stages or both measuring stages, is set by the parameter. Due to this, the use of the plurality of measuring stages is efficiently applied.

Moreover, the present invention is not limited to the wafer probe. The present invention may be applied to a device probe and the other probe apparatuses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plane view showing a probe apparatus having one loader and two measuring stages;

FIG. 2 is a front view of the apparatus of FIG. 1;

FIGS. 4A to 4D are a flow chart showing one embodiment of the probe method of the present invention;

DETAILED DESCRIPTION OF THE PREFERRED EMBODIMENTS

Figure 3:
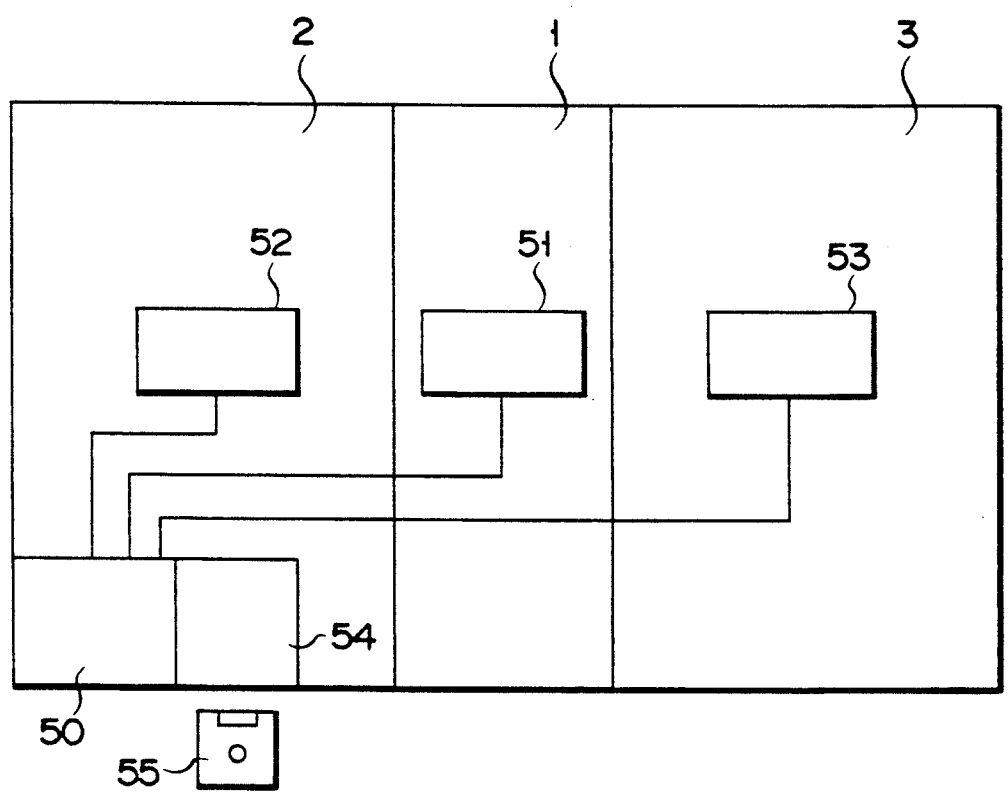
FIG. 3 is a view showing the arrangement of a control section of the apparatus of FIG. 1.

A wafer probe apparatus shown in FIGS. 1 and 2 comprises a loader 1 in its central portion. Then, a first measuring stage 2 is arranged in the left side of the loader 1 and a second measuring stage 3 in the right side of the loader 1.

In this embodiment, plural such as two wafer cassettes 11 are stored in the loader 1. These wafer cassettes 11 are loaded on a cassette loading plate 12 as shown in FIG. 12, and the cassette loading plate 12 is structured to be moved up and down by a motor 13. A pin set 14 is provided to be opposed to the wafer cassettes 11. The pin set 14 is constructed to temporarily fix a wafer W by its lower surface with a suction member. A wafer W is taken up from a position having a desirable height of the cassettes 11, or stored in the cassettes 11 by the pin set 14.

The first and second measuring stages 2 and 3 have the same structure. That is, there is provided rotating arm 21 (or 31) for delivering the wafer W to the loader 1, and mount 22 (or 32) for wafer W in the measuring stage 2 (or 3). The mount 22 (or 32) temporarily fix wafer W by, for example, a suction member. Also, the mount 22 (or 32) is moved to the measuring position by the X-Y stage 23 (or 33), which can be moved in two directions X and Y crossing each other horizontally. Also, the mount 22 (or 32) can be moved in an upper and lower direction Z and a rotating direction $\theta$.

At the measuring position of the measuring stage 2 (or 3), there is provided probe card 25 (or 35) having needle array 24 (or 34) contacting electrode pad array of a semiconductor chip. On the rear side of the upper cylinder of the loader 1, there is formed a support 41, and the support 41 is used as a shaft. An arm 42, which can rotate around the loader 1 at 50° to the right and left, is attached to the support 41. A microscope 43, which can magnify the semiconductor chip to be observed, is attached to the top portion of the arm 42. The microscope 43 is attached to be movable up and down in a vertical direction. The microscope 43 is used common to the measuring stages 2 and 3.

Moreover, as shown in FIG. 3, in the loader 1, first and second measuring stages 2 and 3, there are provided CPUs 51, 52, and 53 for controlling their operations, respectively.

In the first stage 2, there is provided a master CPU 50, which is connected to a floppy disc controller 54 for a floppy disc to be used as input means of a system program and parameters. Then, a floppy disc 55, in which a measuring mode set in accordance with wafers W to be measured, a transfer mode, and a print out mode of the measuring result are written, is loaded on the floppy disc controller 54. Then, the system programs of the measuring stages 2 and 3 and loader 1 are set by the master CPU 50.

In this case, as one of the parameters for a setting mode, there is included a parameter in which wafer W is measured in one of the measuring stages or in both measuring stages. The transfer mode is set in accordance with the measuring mode.

The tips of the probe needles 24 and 34 of the probe cards 25 and 35 are required to be appropriately polished. In this case, a polish timing can be set in the floppy disc 55 as a parameter in advance, so that the tips of the needles can be automatically polished. Moreover, timing of the replacement of the polishing plate of the tips of the probe needles can be set as a parameter. This point will be detailed in the explanation of the flow charts.

The following will explain an operation wherein the measuring mode, which is carried out in accordance with the parameters of preset programs input in the floppy disc 55, executes the first measurement in the first stage 2, thereafter executing the second measurement, which is different from the first measurement in the second measuring stage 3.

First, wafer W is taken up from the cassette 11 by the pin set 14 in accordance with the preset programs. The wafer W is pre-aligned on the basis of the orientation flat. Thereafter, the wafer W is loaded on the mount 22 via the rotating arm 21 of the first measuring stage 2. Then, regarding the wafer W aligned at the position of the fine alignment, it can be confirmed by microscopes 41, 42, 43 that the alignment has been correctly performed with reference to scribed lines or patterns on the wafer W. Thereafter, the mount 22 is moved to the measuring position under the probe card 25 by X-Y stage 23. Then, the loading plate 22 rises by only a predetermined distance, so that the probe needle array of the probe card is brought into contact with an electrode pad array of each semiconductor chip on the wafer W. Under this contacting state, the electrical characteristic of the semiconductor chip can be measured by a tester (not shown). Then, if one chip is or a plurality of chips are simultaneously finished, the wafer is sequentially moved by only the distance of the semiconductor chip or chips, and the contact measuring operation is repeatedly executed, thereby measuring the whole semiconductor chips on the wafer W.

If the measurement of the wafer W is finished, the loading plate 22 falls and is returned to an unload position by X-Y stage 23, and delivered to the pin set 14 of the loader 1 by the rotating arm 21. By the pin set 14, the pre-alignment of the wafer W is performed on the basis of the orientation flat, thereafter the wafer W is loaded on the mount 32 of the second measuring stage 3 via the rotating arm 31. Then, similar to the measurement in the first measuring stage 2, the measurement having a content, which is different from the measurement in the first measuring stage 2, is performed in the second measuring stage 3.

On the other hand, after delivering the wafer W to the mount 32 of the second stage 3, the pin set 14 takes up a next wafer W from the cassette 11 and performs the pre-alignment. Thereafter, the pin set 14 delivers the next wafer W to the first measuring state 2, and the above-mentioned measurement is carried out.

If the measuring mode is set so that the same measurement is performed in the first and second measuring stages 2 and 3 by parameters input in the floppy disc 55, the loader 1 operates so as to alternately dispense wafers W to the first measuring stage 2 and the second measuring stage 3.

According to the above-mentioned probe apparatus, by inputting the system parameters into one floppy disc from one floppy disc controller, the measuring modes are respectively set in the two measuring stages 2 and 3, and different measurements are performed in the measuring stages 2 and 3.

Additionally, in the above probe apparatus, it is considered that the measurement of a non-circular wafer may be performed.

In other words, in the display of the probe apparatus, a selection and a display are performed so as to instruct the distinction between circular and non-circular wafers to CPU 52 or 53. More specifically, for example, there are displayed "NON-CIRCULAR WAFER?", "YES", and "NO". If an operator selects "YES", there are displayed "USE PROFILER?", "YES" and "NO". Then, if the operator selects "YES", the non-circular wafer is measured with the profiler used. In other words, the measurement is performed as the first chip in the measuring direction of the non-circular wafer is automatically detected by the profiler.

If the measurement without using the profiler is selected, a region of the wafer W to be measured is set in the display, thereby the non-circular wafer W is measured. The whole semiconductor chips, which are printed on the wafer W, are measured. However, there is a case in which a portion which is unfavorable for measurement, occurs in a chip pattern printed by a stepper. In a case where there is such an unfavorable portion, a measuring region can be arbitrarily designated by avoiding the chips in the unfavorable portion and designating chips to be favorably measured in the CRT display or the microscope.

An embodiment of the program in which the above-mentioned operations are incorporated will be explained with reference to the flow charts shown in FIGS. 4A to 4D. "W" in the flow charts denotes a wafer.

A wafer is transferred to a designated stage and the alignment of the wafer in relation to the probe card of the stage is carried out (STEP S1) as mentioned above. Since this alignment involves a complicated working which can be carried out by a well-known technique, the explanation will be omitted.

In this embodiment, it is determined whether or not the region to be measured of the wafer is designated (STEP S2). If a region designation mode is determined, the wafer region is designated in a specific form as shown in FIGS. 5A to 5C (STEP S3).

Figure 5A:
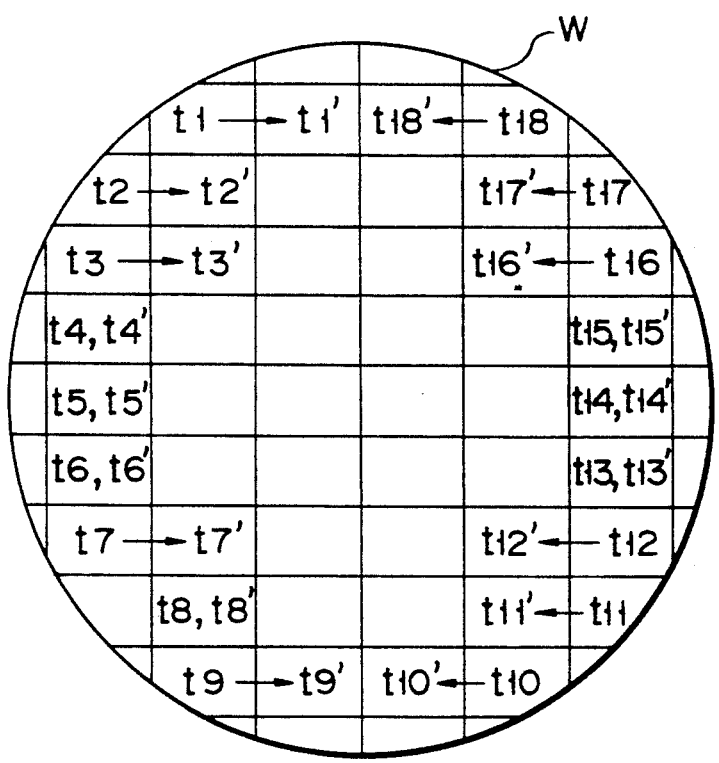
FIGS. 5A to 5C are plane views of wafers for explaining the steps of a regional designation in the probe method according to the present invention.
Figure 5B:
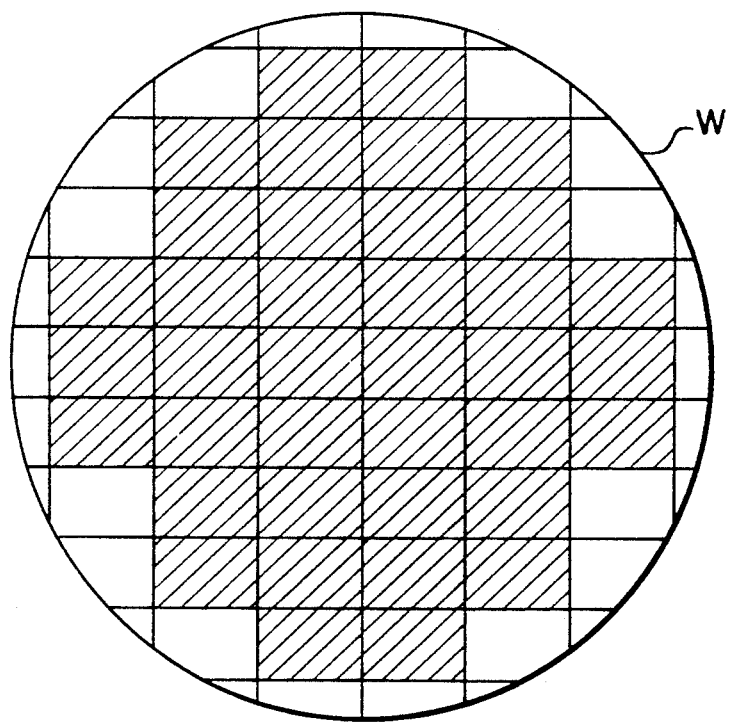
Figure 5C:
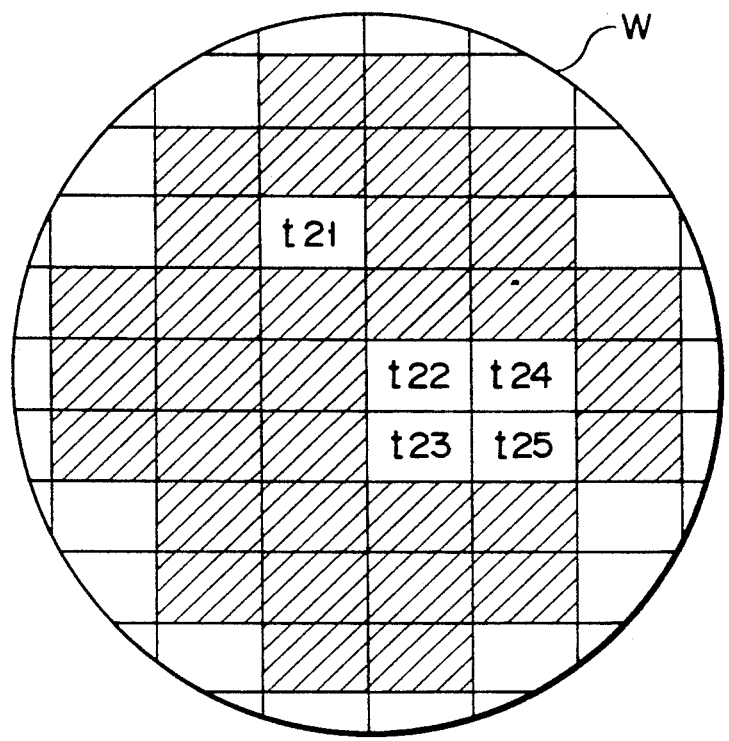

In FIG. 5A, reference numerals t1 to t18 on the wafer W show outer peripheral chips, which are in the measuring range, in a case where the region is not designated. In the region designation mode, chip t1 is positioned under the probe needles. Here, an operator moves the stage so that the chip t1' is positioned under the probe needles. Then, the operator presses a predetermined selection switch, and selects chip t1'. Similarly, in regarding to chips t2 and t3, chips t2' and t3' are selected by moving the stage. Since chip t4 may be positioned as it is, the operator presses the selection switch at the position of chip t4, thereby chip t4 is selected as chip t4'.

If chips t1' to t9' on the left are selected in regarding to chips t1 to t9 as explained above, chips t10' to t18' on the right can be also selected in regarding to chips t10' to t18' in the same steps. By this operation, the region, which is shown by the slanting lines in FIG. 5B, is selected and the chips in only this region are measured.

In this region designation mode, a specific region in the measuring region is not measured and may be skipped. In this case, after the region is designated as mentioned above, the program selectively enters a skip mode. In this mode, for example, if only chip t21 is skipped, the operator moves the stage so that the chip t21 in FIG. 5C is positioned under the probe needles. Then, the selection switch is pressed, and the chip t21 is selected as a skip starting point. Moreover, the selection switch is pressed again, and chip t21 is selected as a skip ending point. By this operation, only chip t21 can be skipped.

In the above skip mode, in order to skip chips t22 to t25, chip t22 is selected as a skip starting point and chip t25 is selected as an skip ending point, thereby these four chips can be skipped.

Figure 6:
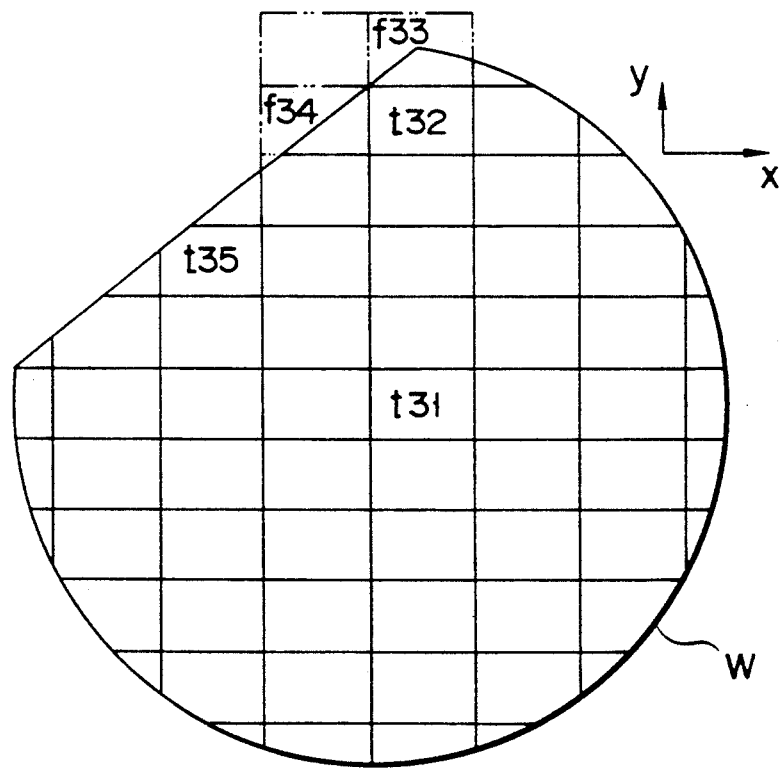
FIG. 6 is a plane view of a non-circular wafer for explaining the steps of obtaining a measuring start position according to the probe method of the present invention.

Back to FIGS. 4A to 4D, when the measuring region of the wafer is not designated or after the measuring region is designated in STEP S3, a non-circular wafer designation mode is executed. Here, first of all, it is designated whether or not the wafer is circular or non-circular as shown in FIG. 6 (STEP S4).

In a case where the wafer is circular, it is determined whether or not the profiler is used (STEP 5). The profiler is an apparatus which has a tactile member provided on the side of the probe card and determines whether or not the chip comes in contact with the probe needles. In a case where the use of the profiler is selected, the measurement is performed by use of the profiler (STEP S6). In this step, all chips or the selected chips are sequentially measured in the above-mentioned manner.

In a case where the use of the profiler is not selected, it is determined by a capacitive sensor whether or not the chip comes in contact with the probe needles in measuring, and the chip is measured (STEP S7). The capacitive sensor is a well-known apparatus and the diameter, the center, and the height position of the wafer can be calculated from the capacity of the wafer. Then, the presence/non-presence of the contact between the chip and the probe needles is determined by the height position. However, there is caused a problem in which the non-circular wafer is regarded as a circular wafer and the respective numeric values are calculated.

In consideration of the above-mentioned disadvantage of the capacitive sensor, the use of the profiler is normally selected in a case where the wafer is non-circular (STEP S8). Moreover, the measuring start point then can be designated here (STEP S9).

Figure 4C:
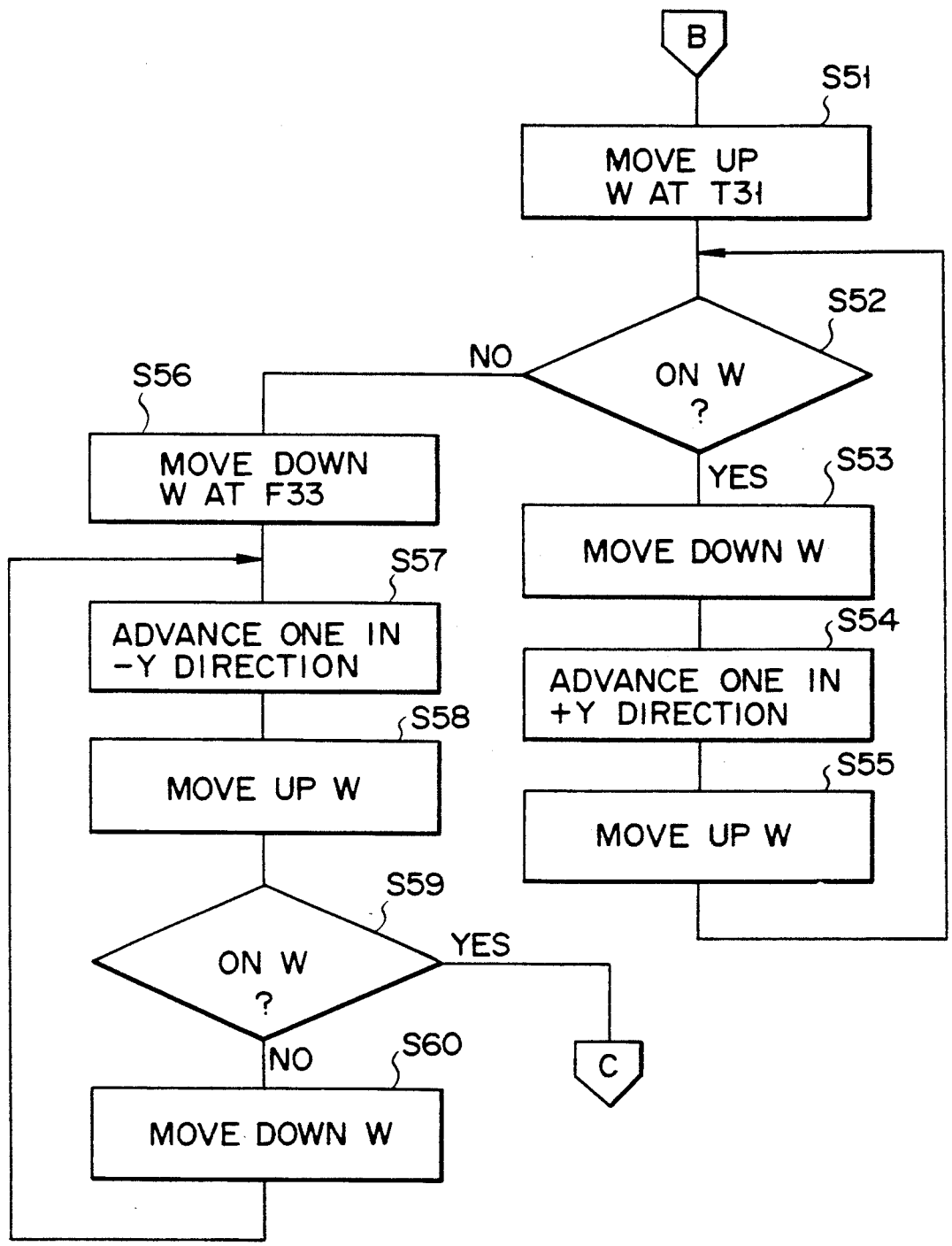

In step S9, if the measuring start point is not designated and the measuring start switch is turned on at the chip t31 in FIG. 6, the measuring start point is determined in the steps shown in FIG. 4C and 4D.

The wafer is moved up at the position of the chip t31 (STEP S51) by the mount and the presence/non-presence of the contact between the chip and the probe needles is determined by the profiler (STEP S52). If the presence of the contact is confirmed, the wafer is moved down (STEP S53), and the mount is moved so that a position of the wafer, which is shifted by one chip in +Y direction, is placed under the probe needles (STEP S54). Thereafter, the wafer is moved up again (STEP S55) and the presence/non-presence of the contact between the chip and the probe needles is determined by the profiler (STEP S52).

The above operation is repeated until the position f33, which is over chip t32 and is out of the wafer, reaches to the position of the probe needles. Since there is no contact between the chip and the probe needles at the position of f33, a response "NO" is displayed in step S52. Then, the wafer is moved down (STEP S56), and the mount is moved so that a position of the wafer, which is shifted by one chip in −Y direction, that is, the chip t32 is positioned under the probe needles (STEP S57). Then, the wafer is moved up (STEP S58), and the presence/non-presence of the contact between the chip and the probe needles is determined (STEP S59). If non-presence of the contact therebetween is determined, the wafer is moved down (STEP S60), and STEPs S57 to S59 are repeated.

In STEP S59, if the presence of the contact therebetween is confirmed, the wafer is moved down at the position of chip t32 (STEP S61), and the mount is moved so that a position of the wafer, which is shifted by one chip in −X direction, that is, position f34 is positioned below the probe needles (STEP S62). Then, the wafer is moved up (STEP S63), and the presence/non-presence of the contact between the chip and the probe needles is determined (STEP S64) by the profiler. If the presence of the contact therebetween is determined, the wafer is moved down (STEP S65), and STEPs S62 to S64 are repeated.

In STEP S64, if the non-presence of the contact therebetween is confirmed, the wafer is moved down at the position f34 (STEP S66), and the mount is moved so that a position of the wafer, which is shifted by one chip in +X direction, that is, the chip t32 is positioned under the probe needles (STEP S68). Then, the wafer is moved up (STEP S68), and the presence/non-presence of the contact between the chip and the probe needles is determined (STEP S69) by the profiler. If the non-presence of the contact therebetween is determined, the wafer is moved down (STEP S70), and STEPs S67 to S69 are repeated.

In STEP S59, the contact therebetween is confirmed, the positions of the uppermost and leftmost portion, that is, the position of the chip t32 is confirmed as a measuring start point (STEP S71) and the chips of the first line where the chip t32 exists are measured. After the measurement of the first line is ended, the mount is automatically moved so that an imaginary chip, which is the leftmost of the second line of an imaginary circular wafer, is positioned under the probe needles. In this case, STEPs 64 to 71 are repeated and the chip of the leftmost portion of the second line of the non-circular wafer is confirmed. Then the chips of the second line are measured. Regarding the chips of the third line and the follows, the similar steps are performed (STEP S72).

Back to FIG. 4B, in STEP S9, in a case where chip t32 of FIG. 6 or chip t36 is moved under the probe needles by the operation of the operator, and the designation is performed by a predetermined selection switch, the measurement is started from the designation position in the manner of the above-mentioned embodiment.

If the use of the profiler is not selected in STEP S8, it is determined whether or not the chip contacts the probe needles by use of the above-mentioned capacitive sensor, and the measurement is executed (STEP S12). However, in a case where the capacitive sensor is used, the non-circular wafer is regarded as a circular wafer during the measurement. This is not preferable in view of the maintenance of the probe needles.

Back to FIG. 4A, a needle polishing mode can be selected during the measurements in STEPs S6, S7, S72, and S12 (STEP S13). After the tips of the needles are polished (STEP S14), it is determined whether or not the measurement is finished (STEP S15). If the measurement is not finished, the measurement is continued. (STEP S16).

After the measurement, it is discriminated whether or not there is a designation in which the wafer is delivered to the other stage. If there is a designation, the wafer is delivered to the other stage, and the above-mentioned steps are repeated in the other stage. If there is no designation, the wafer is returned into the wafer cassette (STEP S19). Then, it is discriminated whether or not there is a next wafer to be measured (STEP S20). The next wafer is transferred from the cassette if there is (STEP S20), and the above-mentioned steps are repeated (STEP S21).

Figure 7:
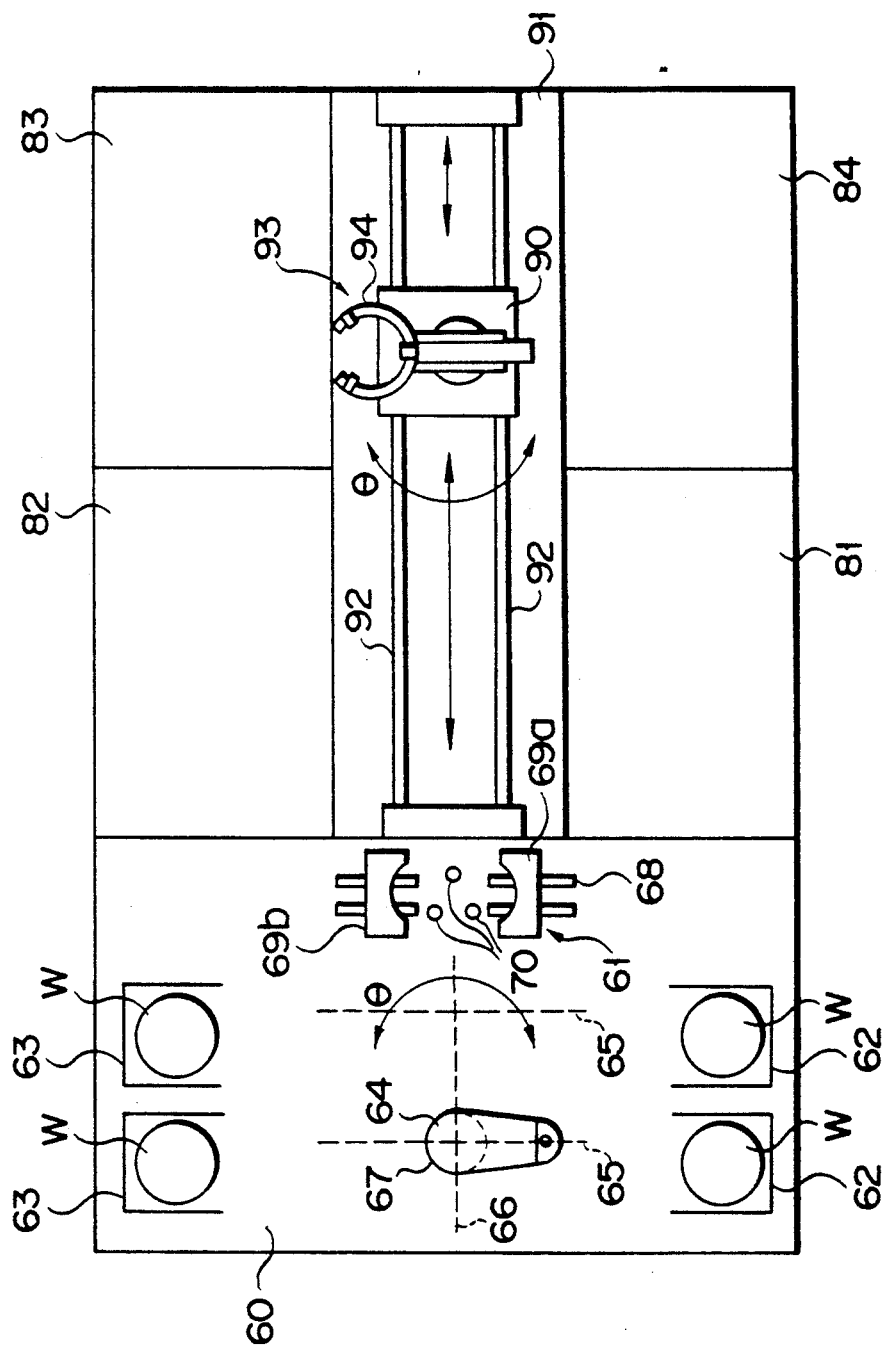
FIG. 7 is a plane view showing a probe apparatus having one loader and four measuring stages.

The above embodiment explained the case in which two stages are provided in the probe apparatus. The present invention can be applied to a case where three or more stages are provided in the probe apparatus. FIG. 7 shows a probe apparatus having one loader 60 and four measuring stages 81 to 84.

On the loader 60, there are positioned a cassette 62 storing unmeasured wafers and a cassette 63 storing measured wafers. There is provided a wafer suction pin set 64 around the loader 60 in order to be movable among a wafer delivery plate 61, cassettes 62 and 63. The pin set 64 is supported by an X-axis moving mechanism 65, a Y-axis moving mechanism 66, and $\theta$ rotating mechanism 67.

The respective cassettes 62 and 63 are supported by a rising mechanism (not shown), and can move up and down in cooperation with the movement of the pin set 64 at the respective standby positions. By this operation, the positions of the cassettes 62 and 63 and the pin set 64 in height are adjusted.

The delivery plate 61 has a guide rail 68, a pair of sliders 69a, 69b, and a set of three supporting pins 70. The opposing surfaces of the sliders 69a and 69b are curved along the outer periphery of a wafer, and cone-shaped or tapered, that is, the lower diameter of the surfaces is smaller than the upper diameter thereof. The pair of the sliders 69a and 69b are formed to be slid each other on the guide rail 68 in the opposite directions by a driving motor (not shown). In other words, if the sliders 69a and 69b are slid, the space therebetween expands or contacts.

Three supporting pins 70 are formed uprightly at the lower perpendicular portion of the intermediate position between the sliders 69a and 69b in order to move up and down by the pin rising apparatus (not shown). The wafer is centered with respect to a transferring robot 90 on the side of the measuring stages by these pins and the sliders 69a and 69b.

In the central portion of the four measuring stages 81 to 84, there is a track 91. In the track 91, there is provided a rail 92, and the transferring robot 90 is mounted on the rail 92. The robot 90 has a handling mechanism 93, and two support frames 94 for supporting the wafers are provided in the upper and lower portions of the handling mechanism 93. The respective support frames 94 can be independently operated in a X, Y, Z, or $\theta$ direction.

Even in the probe apparatus shown in FIG. 7, the program as explained in FIGS. 4A to 4D is used and four measuring stages 81 to 84 can be efficiently used. In other words, according to the present invention, parameters with respect to each measuring stage can be set by one input means, so that it can be set that a wafer is measured in one of the measuring stages or that a wafer is measured in the plurality of measuring stages. Due to this, the plurality of measuring stages can be efficiently used.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A probe method wherein probe needles are brought into contact with electrode pads of objects to be measured arranged on a substrate and in a predetermined region, and whose electrical characteristics are to be measured in each measuring stage in a probe apparatus having a plurality of measuring stages in relation to one loader, comprising the steps of:

transferring said substrate to a designated stage of said stages;

loading said substrate on a mount provided in said designated stage, said mount being movable in X-Y directions which cross each other and being rotatable in a X-Y plane;

positioning said substrate with respect to said probe needles based on a relationship between an array direction of said objects on said substrate and a measuring order of said objects, and a corresponding relationship between said probe needles and said electrode pads;

discriminating whether or not said substrate is a cut-out substrate having said predetermined region partially cut out;

selecting one of two steps if said substrate is a cut-out substrate, one of said two steps being the step of designating the range of said objects to be measured, and the other being the step of using detecting means, which has a tactile sense detecting contact between said probe needles and said object, when measuring;

sequentially measuring each object as said substrate is moved with said mount with respect to said probe needle; and removing said substrate from said mount after the end of measuring.

2. The probe method according to claim 1, wherein it is discriminated whether or not a program in which said substrate is measured in one of the other measuring stages is set after the end of measuring.

3. The probe method according to claim 1, wherein said method further comprises the step of selecting whether or not tips of said probe needles are polished after the end of measuring.

4. The probe method according to claim 1, wherein if said detecting means is selected to be used, said method further comprises the step of selecting whether or not one of said objects is designated as the start of measuring.

5. The probe method according to claim 1, wherein display means is provided for performing a selection and a display so as to instruct a determination result of whether or not said substrate is a cut-out substrate.

6. The probe method according to claim 5, wherein said substrate is a semiconductor wafer, and said measuring object is a semiconductor chip.

7. The probe method according to claim 6, wherein "NON-CIRCULAR WAFER?" for asking whether or not said substrate is a cut-out substrate, and "YES" and "NO" for answering the question are displayed on said display means.

8. The probe method according to claim 7, wherein if the "YES" is selected, a selection and a display are subsequently performed on said display means so as to instruct whether or not said detecting means is used.

9. The probe method according to claim 8, wherein if said detecting means is not selected to be used, designation of the range of said objects to be measured is performed on said display means.

10. The probe method according to claim 4, wherein if one of said objects is not designated as the start of measuring, said probe method further comprises the steps of:

sequentially moving said substrate by a distance corresponding to the space of one object in one of said X and Y directions from one of said objects on said substrate, and detecting contact between said probe needles and each object by said detecting means;

continuing the movement of said substrate until the contact is not confirmed, and stopping said movement when the contact is not confirmed;

sequentially moving said substrate by a distance corresponding to the space of one object in the opposite direction to said one direction and detecting contact between said probe needles and each object by said detecting means;

continuing the movement of said substrate until the contact is confirmed, and stopping said movement when the contact is confirmed; and recognizing one of said objects, which is positioned under said probe needles at this time, as the start of measuring.

11. The probe method according to claim 10, wherein it is discriminated whether or not a program in which said substrate is measured in one of the other measuring stages is set after the end of the measuring.

12. The probe method according to claim 10, wherein said method further comprises the step of selecting whether or not the tips of said probe needles are polished after the end of measuring.

13. The probe method according to claim 10, wherein display means is provided for performing a selection and a display so as to instruct a determination result of whether or not said substrate is a cut-out substrate.

14. The probe method according to claim 10, wherein said substrate is a semiconductor wafer, and said measuring object is a semiconductor chip.

15. The probe method according to claim 10, wherein before recognizing one of said objects, which is positioned under said probe needles at this time, as the start of measuring, said probe method further comprises the steps of:

sequentially moving said substrate by a distance corresponding to the space of one object in the other of said X and Y directions, and detecting contact between said probe needles and each object by said detecting means;

continuing the movement of said substrate until the contact is not confirmed, and stopping said movement when the contact is not confirmed;

sequentially moving said substrate by a distance corresponding to the space of one object in the opposite direction to said other direction, and detecting contact between said probe needles and each object by said detecting means; and continuing the movement of said substrate until the contact is confirmed, and stopping said movement when the contact is confirmed.

16. The probe method according to claim 15, wherein it is discriminated whether or not a program in which said substrate is measured in one of the other measuring stages is set after the end of measuring.

17. The probe method according to claim 15, wherein said method further comprises the step of selecting whether or not the tips of said probe needles are polished after the end of measuring.

18. The probe method according to claim 15, wherein display means is provided for performing a selection and a display so as to instruct a determination result of whether or not said substrate is a cut-out substrate.

19. The probe method according to claim 15, wherein said substrate is a semiconductor wafer, and said measuring object is a semiconductor chip.

* * * * *